United States Patent
Ostendorf

(10) Patent No.: US 7,206,985 B2
(45) Date of Patent: Apr. 17, 2007

(54) METHOD AND APPARATUS FOR CALIBRATING A TEST SYSTEM FOR AN INTEGRATED SEMICONDUCTOR CIRCUIT

(75) Inventor: Hans-Christoph Ostendorf, Munich (DE)

(73) Assignee: Infineon Technologies AG, Munich (DE)

( * ) Notice: Subject to any disclaimer, the term of this patent is extended or adjusted under 35 U.S.C. 154(b) by 475 days.

(21) Appl. No.: 10/139,835

(22) Filed: May 7, 2002

(65) Prior Publication Data

US 2002/0178409 A1    Nov. 28, 2002

(30) Foreign Application Priority Data

May 7, 2001    (DE)    ............... 101 22 081

(51) Int. Cl.
*G06F 11/00*    (2006.01)

(52) U.S. Cl. ........................ 714/738; 714/744

(58) Field of Classification Search ................. 714/738
See application file for complete search history.

(56) References Cited

U.S. PATENT DOCUMENTS 4,928,278 A * 5/1990 Otsuji et al. ................. 714/700
5,502,397 A * 3/1996 Buchanan ................... 324/754
6,005,731 A * 12/1999 Foland et al. ................. 360/53
6,006,349 A * 12/1999 Fujisaki ...................... 714/738
6,021,515 A * 2/2000 Shimura ..................... 714/738
6,105,157 A    8/2000 Miller

OTHER PUBLICATIONS

Wikipedia Online Encyclopedia. Flip-flop. http://en.wikipedia.org/wiki/Flip-flop.*
Abramovici, Miron, Melvin A. Breuer, and Arthur D. Friedman. Digital Systems Testing and Testable Design. Piscataway, NJ: IEEE Press Marketing, 1990.*
Kikuchi et al., "A Gate-Array-Based 666MHz VLSI Test System", International Test Conference, pp. 451-458.

* cited by examiner

*Primary Examiner*—Guy Lamarre
*Assistant Examiner*—Steve Nguyen
(74) *Attorney, Agent, or Firm*—Schiff Hardin LLP

(57) ABSTRACT

A method and an apparatus provides for calibrating a test system for an integrated semiconductor circuit, a pattern generator of the test system generating a test signal in the form of a pattern of successive rising and falling edges, which is composed of superposed sub-patterns formed via different internal paths of the pattern generator. The pattern generator provides an information signal for a measuring device of the test system, which identifies the edges of at least one sub-pattern of the test signal with regard to their origin from one of the internal paths. The calibration is carried out for the internal path separately using the information signal.

12 Claims, 3 Drawing Sheets

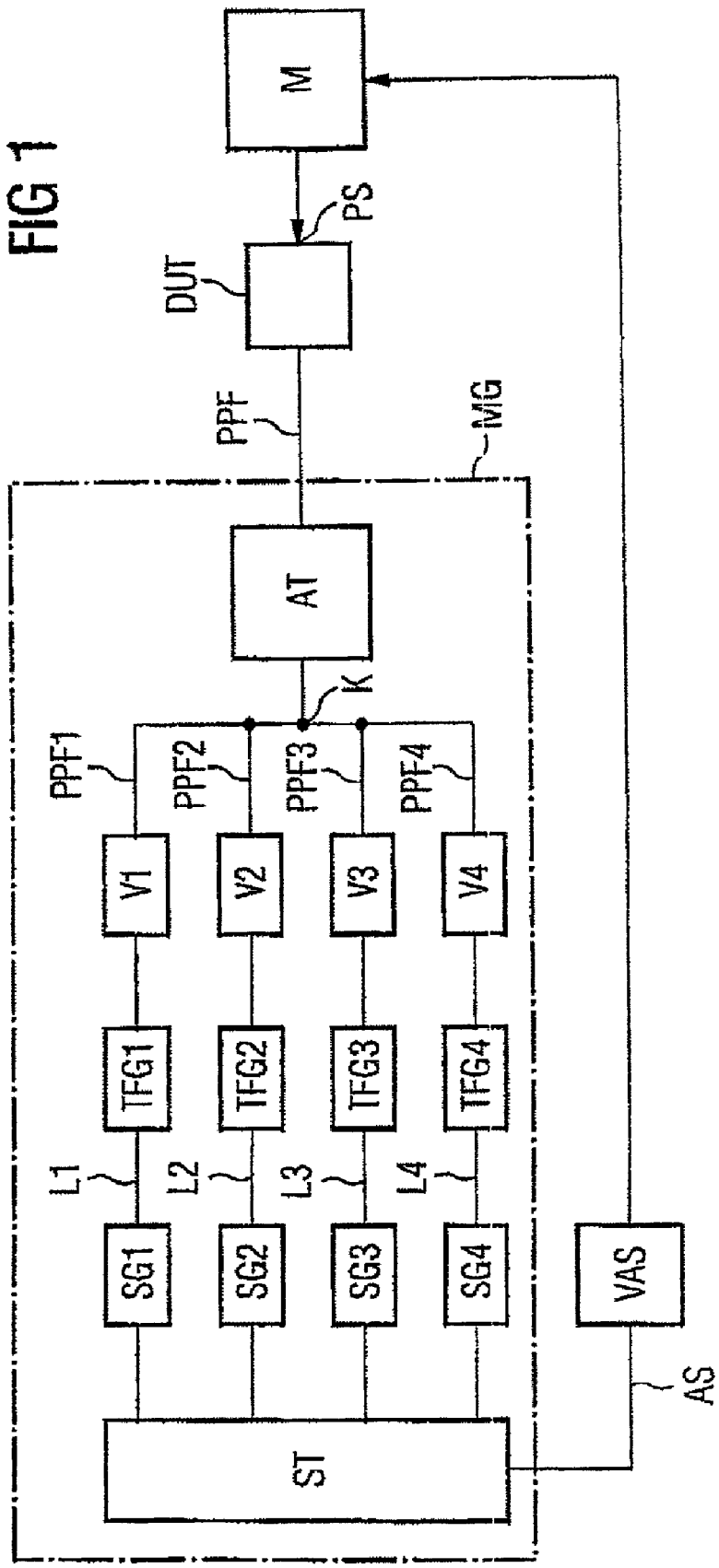

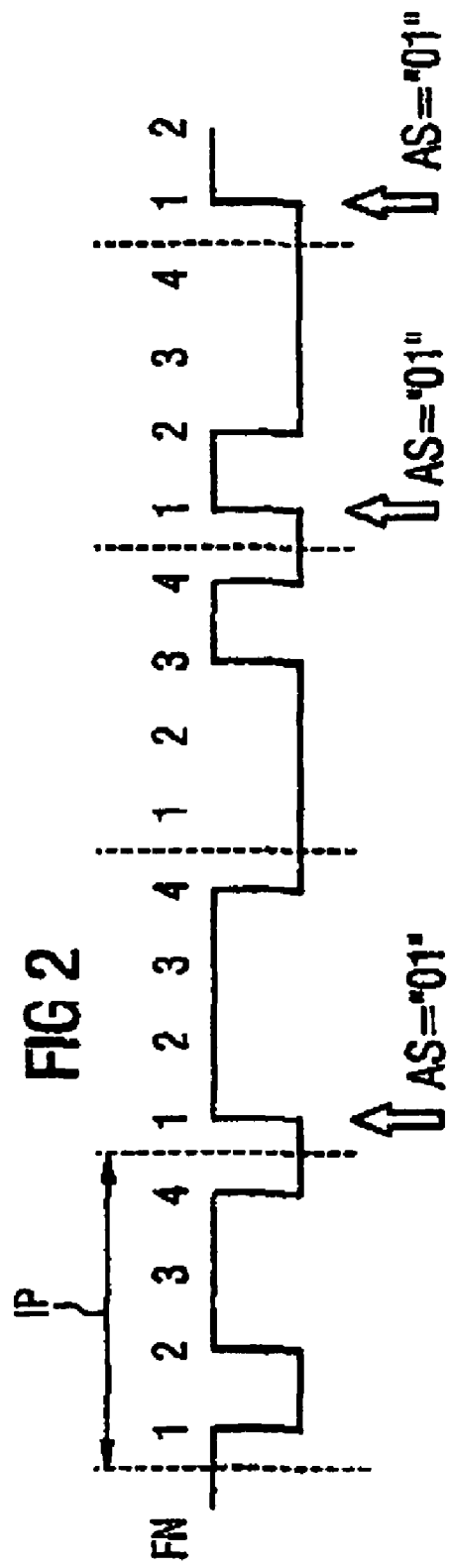
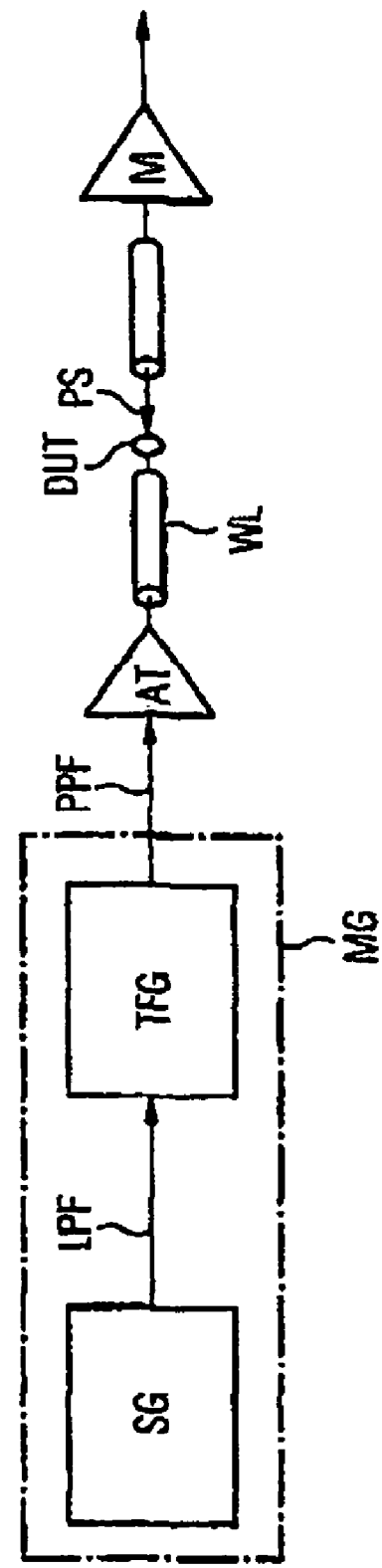
FIG 4 (Prior Art)

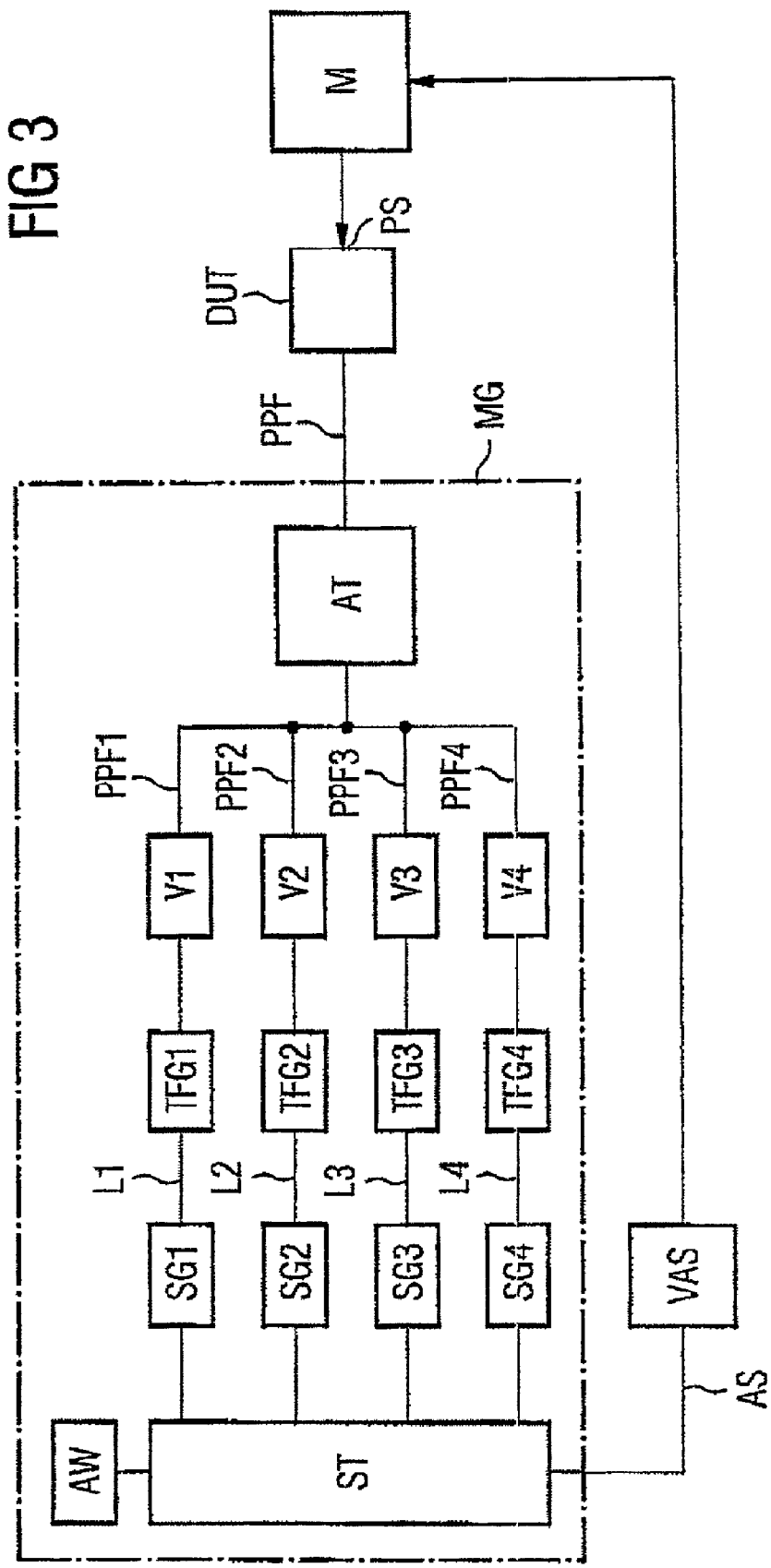

METHOD AND APPARATUS FOR CALIBRATING A TEST SYSTEM FOR AN INTEGRATED SEMICONDUCTOR CIRCUIT

BACKGROUND OF THE INVENTION

1. Field of the Invention

The present invention relates to a method and an apparatus for calibrating a test system for an integrated semiconductor circuit, a pattern generator of the test system generating a test signal in the form of a pattern of successive rising and falling edges, which is composed of sub-patterns formed via different internal paths of the pattern generator.

Although applicable, in principle, to any desired integrated circuits, the present invention and the problems on which it is based are explained with regard to integrated DRAM circuits in silicon technology.

2. Description of the Related Art

When testing semiconductor devices at very high data rates(typically 800 Mbit/sec), very stringent requirements are imposed on the positioning accuracy of the signal edges of a corresponding test system. The required accuracy, e.g. for testing high performance DRAMs, is an error of less than 50 ps. High performance test systems in this accuracy range typically use a calibration method in which the signals generated by the tester are detected as near as possible to the interface to the semiconductor module, measured and corrected in terms of their temporal position.

In the accuracy range discussed, it is necessary to establish for the calibration of the test system a situation which approaches the real measurement situation as closely as possible. That concerns not only the implementation of the measurement setup for calibration but also the pulse train ("pattern") driven by the driver of the test system. In this case, it is primarily important also to take account of the influence of different pulse trains, since (e.g. as a result of parasitic effects) the position of an edge can change depending on its history. Therefore, the test system should be calibrated with a pattern which covers all pulse trains that occur in the application.

A further boundary condition imposed on the calibration by many test systems is due to the fact that a signal at a pin is composed internally via different signal processing paths which, in principle, all have to be calibrated in separately. Thus, e.g. in specific test systems, rising and falling edges are generated by different hardware resources and have to be calibrated separately. Furthermore, the internal resources (here the timing generator below) of the test system often do not operate at the maximum signal frequency which can be generated by the system on the device, but rather at e.g. half or quarter the frequency, i.e. the timing generator not only generates two edges per cycle, but four or eight. The consequence of this is that directly successive edges are also generated via different signal paths and therefore have to be calibrated separately.

FIG. 4 Shows a Diagrammatic Illustration of a Known High—Speed Test System.

In FIG. 4, MG designates a pattern generator. The pattern generator MG contains a sequence generator SG, which generates a logical pulse shape (that is to say a sequence of 1/0 information items) LPF, and also a timing/format generator TFG, which converts the logical pulse shape LPF into a physical signal waveform PPF. The signal waveform PPF is output by the driver AT via a corresponding waveguide WL to the module to be tested DUT. During the calibration operation, the test tip PS takes up the signal from the module to be tested DUT and forwards it to the measuring device M.

Such high-speed test systems have hitherto been measured or calibrated with the aid of a suitable measuring device (e.g. oscilloscope, zero crossing detector). In this case, the test system drives only those edges whose generation path is currently intended to be calibrated, e.g. only rising edges of an individual signal path. As a result, it is possible in a simple manner to calibrate the individual signal paths in the test system.

This Method Has Two Essential Disadvantages:

Firstly, the calibration is necessarily carried out with a regular pattern, i.e. the generated signal is periodic with a fixed frequency and fixed duty ratio. Although that corresponds well to the situation with a clock signal for a device, for data and control signals pulse trains are applied irregularly to the module.

However, an irregular pattern generates a significantly broader frequency spectrum in the signal path than a regular pattern. As a result, shifts in the positioning of the signal edge can arise due to resonances, frequency-dependent propagation times and limitations in the rise times. The position of the signal edge becomes dependent on the history.

Secondly, the restriction to a single signal path often also means that the measurement frequency is reduced.

This occurs if e.g. the timing generator operates internally at a quarter of the output frequency and, therefore, in this case generates eight edges within its internal period. During the calibration, the timing generator is then permitted to generate the measured signals only for the edges which are actually intended to be calibrated. At the remaining times at which an edge is generated during testing, no edge is permitted to be generated during calibration, since otherwise a plurality of signal paths would determine and thus corrupt the measurement. This, too, can result in altered transmission properties, so that the calibration is not optimally adapted to the later application. Both points bring about a deterioration in the calibration accuracy during the module measurement.

An improved adaptation of the calibration to the conditions during the module test is afforded by the following method: for this purpose, a pseudorandom play is generated at the play frequency and this is measured using a digital sampling oscilloscope (DSO) in the cumulative measurement mode. This produces—by superposition of many different signal edges—a so-called data eye diagram. By evaluating this data eye diagram it is possible to determine and compensate for an incorrect calibration.

Although this method allows the conditions largely to be readjusted during the measurement, it is not possible, however, to take account of the individual signal paths of the test system separately from one another, since the data eye diagram is only produced by the superposition of all the edge types. Moreover, the use of an oscilloscope means that this method requires a very long time, so that it cannot be employed economically for the calibration of a highly parallel production test system.

SUMMARY OF THE INVENTION

Therefore, it is an object of the present invention to provide a method and apparatus for calibrating a test system for an integrated semiconductor circuit, in which case a test system can be calibrated, under the boundary conditions mentioned, rapidly but nevertheless close to the application with an irregular (i.e. random) pulse train.

According to the invention, this object is achieved by the method for calibrating a test system for an integrated semiconductor circuit, wherein a pattern generator of the test system generates a test signal in the form of a pattern of successive rising and falling edges, which is composed of superposed sub-patterns formed via different internal paths of the pattern generator; the pattern generator providing an information signal for a measuring device of the test system, which identifies the edges of at least one sub-pattern of the test signal with regard to their origin from one of the internal paths; and the calibration is carried out for the internal path separately using the information signal. The invention also provides a corresponding apparatus for calibrating a test system for an integrated semiconductor circuit having a pattern generator of the test system generating a test signal in the form of a pattern of successive rising and falling edges, which is composed of superposed sub-patterns formed via different internal paths of the pattern generator; and a provision device for providing an information signal, which identifies the edges of at least one sub-pattern of the test signal with regard to their origin from one of the internal paths.

BRIEF DESCRIPTION OF THE DRAWINGS

Exemplary embodiments of the invention are illustrated in the drawings and explained in more detail in the description below.

FIG. 1 is a functional block diagram of a test system for elucidating a first embodiment of the present invention;

FIG. 2 is an illustration of a test signal for the test system according to FIG. 1;

FIG. 3 is a functional block diagram of a test system for elucidating a second embodiment of the present invention; and FIG. 4 is a functional block diagram of a known test system.

DETAILED DESCRIPTION OF THE PREFERRED EMBODIMENTS

The idea underlying the present invention is that each internal signal path can be taken into account separately through the activation information.

Compared with the known solution approach, the method according to the invention and the corresponding apparatus have, inter alia, the advantage that the above-described two requirements made of the calibration method are brought into accord:

1. Use of a pseudorandom pattern close to reality for the measurement of the edge positions of the drivers.
2. Separate measurement of the different internal signal paths which contribute to the generation of the test signal.

For this purpose, firstly a pattern program is generated which generates the desired signal sequence at the tester output to be calibrated. The measuring device for the tester signal is provided with an activation signal which makes it possible to determine for each individual tester cycle whether or not the measuring device is to perform an individual measurement.

This activation signal can likewise be controlled from the pattern program and thus allows the measurement operations of the measuring device to be restricted to precisely the edges whose signal path required for generation is currently intended to be calibrated. In this way, it is possible to generate for the calibration a signal which covers all application-typical pulse trains (and is generated with the aid of all the internal signal paths), and nevertheless to restrict the position determination to the edges of a signal path.

The implementation of the activation signal in the measuring device should be relatively simple to carry out since this does not require intervention in the sensitive analog input circuit of the measuring device. Rather, this function can be effected at the level of the digital signal processing. In other words, the analog input circuit and the digital-to-analog conversion operate continually, and only in the course of the digital further processing is a decision taken as to whether the measured results are taken into account or rejected.

For the activation signal, a synchronization between the pattern generator and the measuring device must be effected, which takes account of the signal propagation times of the measurement signal from the pattern generator to the measuring device. However, this need only be accurate enough that the correct tester cycle is "hit". In other words, the accuracy requirements imposed on this synchronization are of the order of magnitude of the tester period.

By virtue of the apparatus described, the electrical conditions during calibration are adapted significantly better to the situation during the module test, which leads to greater application proximity and thus to an improvement in the edge positioning during the module test. Further advantages of the invention reside in the fact that, apart from the implementation of the activation signal in the measuring device, there is no need for any fundamental change to the measurement setup. Therefore, no significant lengthening of the calibration duration compared with the conventional calibration method is to be expected either.

Advantageous developments and improvements of the method, for the information signal, provides that the synchronization between the pattern generator and the measuring device of the test system is performed by a delay device. The measuring device may be activated by the information signal in each case only for a measurement of the edges of the internal path which is being calibrated in each case. The information signal may be a digital signal which identifies each individual edge of the test signal with regard to its origin from one of the internal paths. In addition, for the calibration, a respective internal path is assigned a signal delay device, which is set taking account of the measurement result of the measuring device for the respective internal signal path.

Advantageous developments and improvements of the apparatus are that a delay device is provided, by which synchronization between the pattern generator and the measuring device of the test system can be performed for the information signal. The measuring device can be activated by the information signal in each case only for a measurement of the edges of the internal path which is being calibrated in each case. The information signal may be a digital signal which identifies each individual edge of the test signal with regard to its origin from one of the internal paths. For the calibration, a respective internal path may be assigned a signal delay device.

In accordance with one preferred development, for the information signal, synchronization between the pattern generator and the measuring device of the test system is performed by means of a delay device.

In accordance with a further preferred development, the measuring device is activated by the information signal in each case only for a measurement of the edges of the internal path which is being calibrated in each case.

In accordance with a further preferred development, the information signal is a digital signal which identifies each individual edge of the test signal with regard to its origin from one of the internal paths.

In accordance with a further preferred development, for the calibration, a respective internal path is assigned a signal delay device, which is set taking account of the measurement result of the measuring device for the respective internal signal path.

In the figures, identical reference symbols designate identical or functionally identical component parts.

FIG. 1 is a diagrammatic illustration of a test system for elucidating an embodiment of the present invention.

In accordance with FIG. 1, the pattern generator MG of this embodiment contains a control device ST, which drives four sequence generators SGI, SG2, SG3 and SG4 in accordance with a predetermined program. The sequence generators SG 1 to SG4 in each case generate a corresponding logical pulse train L1, L2, L3 and L4, respectively. Connected downstream of the sequence generators SG 1 to SG4 are respective timing/format generators TFG1, TFG2, TFG3 and TFG4, and connected downstream of the latter in turn are respective delay devices Vl, V2, V3 and V4.

In this way, in the pattern generator MG according to FIG. 1, four different physical signal waveforms PPF1, PPF2, PPF3 and PPF4 are generated on four different internal paths and are combined or superposed at a node K. Connected to the node K is the output driver AT, which supplies the actual test signal as composite physical signal waveform PPF, which is fed to the device under test DUT. The measuring device M is connected to the device under test DUT in a known manner via a test tip, or test point, PS.

In the present first embodiment, the pattern generator MG, in this case the control device ST thereof, provides an information signal AS and forwards it via an adjustable delay device VAS to the measuring device M, which signal specifies for each individual edge of the test signal PPF the path by which it is generated, i.e. whether, in the present example, it is to be assigned to the physical signal waveform PPF1, PPF2, PPF3 or PPF4. This information signal AS may assume e.g. a digital form with two bits.

In this case, e.g. a dedicated comparator of a test system could be used as the measuring device M, the comparator having a digital driving input with which the measurement operation can be controlled in accordance with the signal AS.

For the synchronization of the information signal AS, a short synchronization run can be carried out before the actual calibration measurement, the synchronization run determining the propagation times in the measurement signal path and programming the required delays of the delay device VAS. Since here it is only important to hit the correct tester cycle, this can be implemented e.g. at the level of the pattern generator MG in the form of FIFO shift registers.

FIG. 2 Shows an Illustration of a Test Signal for the Test System According to FIG. 1.

In FIG. 2, FN designates the number of the respective edge. In the present example, within an internal period IP, a total of four edges corresponding to the four internal paths are generated, which are designated here by 1 to 4. Furthermore, in the present example, the rising edges number 1 are generated by the first internal signal path SG1, TFG1 and V1. Correspondingly, the information signal AS indicates through corresponding signals AS="01" in the second, fourth and fifth internal periods, which are illustrated in FIG. 2, that the corresponding edge is associated with this first internal path. Correspondingly, in the respective tester cycles, an individual measurement of the corresponding edge is performed by the measuring device M. Corresponding different signals are provided for identifying the other edges. Consequently, the measuring device M can selectively measure all the internal paths separately.

By virtue of the fact that the information signal AS is synchronized within the entire system, the correct tester period is in each case selected by the measuring device M. In this way, each of the four internal signal paths can be calibrated separately, since the controllable measuring device M in each case measures only those edges whose internal signal path is currently being calibrated. In particular, this calibration is effected by a suitable setting of the respective delay device V1, V2, V3 or V4.

FIG. 3 shows a diagrammatic illustration of a test system for elucidating a second embodiment of the present invention.

In the first embodiment above, a dedicated digital information signal AS is supplied for each edge, and the measuring device M selectively measures the respective internal path.

In the second embodiment in accordance with FIG. 3, the control device ST contains four different calibration programs corresponding to the four internal paths, which can be selected by means of a selection device AW. The first calibration program supplies an information signal AS in the form of an analog pulse in the event of each edge of the first internal path. The second calibration program supplies an information signal AS in the form of an analog pulse in the event of each edge of the second internal path. The third calibration program supplies an information signal AS in the form of an analog pulse in the event of each edge of the third internal path. The fourth calibration program supplies an information signal AS in the form of an analog pulse in the event of each edge of the fourth internal path. Thus, all four internal paths can be calibrated separately.

In this case, e.g. a dedicated comparator of a test system could be used as the measuring device M, the comparator having an analog driving input which can be used to control the measurement operation in accordance with the signal AS for each internal path.

Although the present invention has been described above using preferred exemplary embodiments, it is not restricted thereto, but rather can be modified in diverse ways.

In particular, the configuration of the information signal is not restricted to the forms explained. Moreover, it is not always necessary for all the internal paths to be calibrated, thus, under certain circumstances, only one or part of the totality of all the internal paths.

Although other modifications and changes may be suggested by those skilled in the art, it is the intention of the inventors to embody within the patent warranted hereon all changes and modifications as reasonably and properly come within the scope of their contribution to the art.

I claim:

1. A calibratable test system for an integrated circuit, comprising:

a pattern generator having a plurality of internal signal paths for generating sub-patterns, each of said internal signal paths including a sequence generator for generating a logical pulse stream and a timing format generator arranged thereafter, a node to which said plurality of internal signal paths are connected so that the sub-patterns generated by the signal paths are put together by superimposing in order to form a test signal as a pattern of sequent raising and falling signal edges; and a control connected to said pattern generator to select one or more of said plurality of internal signal paths so as to provide different test signals by different superimposed sub-patterns, said control constructed to provide an information signal for a measurement device of said test system which indicates for each individual signal edge of at least one sub-pattern generated by an internal signal path the internal signal path which generated the at least one sub-pattern, wherein said control provides said information signal for said measurement device synchronously to each signal edge.

2. A test system according to claim 1, wherein each internal signal path comprises a signal delay for calibrating.

3. A test system according to claim 1, further comprising: a delay connected by which a synchronization between said pattern generator and said measurement device of said test system for said information signal is arranged.

4. A test system according to claim 1, wherein said measurement device is activated by said information signal only for a measurement of the edges of the selected one or more internal signal path.

5. A test system according to claim 1, wherein said information signal is a digital signal.

6. A test system according to claim 1, wherein the control includes a respective calibration program for each of said plurality of internal signal paths.

7. A test system according to claim 6, wherein said calibration programs are selected by a selector.

8. A method for calibrating a test system for an integrated semiconductor circuit, comprising the steps of:
    generating a test signal in a form of a pattern of sequential raising and falling edges by a pattern generator, said step of generating said test signal including superimposing sub-patterns which are provided via a plurality of different internal signal paths of said pattern generator, each of said internal signal paths including a sequence generator operable for generating a logical pulse stream and a timing format generator connected to an output of said sequence generator;
    selecting one or more internal signal paths from a plurality of the internal signal paths to generate different test signals of different superimposed sub-patterns; and
    providing an information signal by a control for a measurement device of the test system which indicates for each individual edge of at least one sub-pattern of said test signal the internal signal path which generated the at least one sub-pattern, wherein said control provides said information signal to said measurement device synchronously to each signal edge.

9. A method according to claim 8, wherein said internal paths are calibrated by an associated separate delay which is adjusted for the respective internal signal path dependent on a measurement result of said measurement device.

10. A method according to claim 8, wherein said pattern generator is synchronized with said measurement device of said test system for said information signal with a delay.

11. A method according to claim 8, wherein said measurement device is activated by said information signal only for a measurement for the edges of the associated internal path.

12. A method according to claim 8, wherein said information signal is a digital signal.

* * * * *